(12) United States Patent
Dieny et al.

(10) Patent No.: US 6,987,651 B2
(45) Date of Patent: Jan. 17, 2006

(54) MULTILAYERED STRUCTURES COMPRISING MAGNETIC NANO-OXIDE LAYERS FOR CURRENT PERPENDICULAR TO PLANE GMR HEADS

(75) Inventors: Bernard Dieny, Lans en Vercors (FR); Cheng Horng, San Jose, CA (US); Kochan Ju, Fremont, CA (US); Min Li, Fremont, CA (US); Simon Liao, Fremont, CA (US)

(73) Assignee: Headway Technologies, Inc., Milpitas, CA (US)

(*) Notice: Subject to any disclaimer, the term of this patent is extended or adjusted under 35 U.S.C. 154(b) by 0 days.

(21) Appl. No.: 11/091,623

(22) Filed: Mar. 28, 2005

(65) Prior Publication Data
US 2005/0248888 A1 Nov. 10, 2005

Related U.S. Application Data

(62) Division of application No. 09/953,539, filed on Sep. 17, 2001, now Pat. No. 6,888,703.

(51) Int. Cl.
G11B 5/127 (2006.01)

(52) U.S. Cl. .................................... 360/324.1
(58) Field of Classification Search ...................... None
See application file for complete search history.

(56) References Cited

U.S. PATENT DOCUMENTS

| 5,650,958 | A | 7/1997 | Gallagher et al. | 365/173 |
| 5,668,688 | A | 9/1997 | Dykes et al. | 360/113 |
| 5,898,548 | A | 4/1999 | Dill et al. | 360/113 |
| 6,111,784 | A | 8/2000 | Nishimura | 365/173 |
| 6,171,693 | B1 | 1/2001 | Lubitz et al. | 428/332 |
| 6,198,609 | B1 | 3/2001 | Barr et al. | 360/322 |
| 2001/0006444 | A1 * | 7/2001 | Hayakawa et al. | 360/324.1 |

OTHER PUBLICATIONS

K. Nagasaka et al., "Giant Magnetoresistance Properties of a Specular Spin Valve Films in a Current Perpendicular to Plane Structure", Journal of Applied Physics, vol. 89, No. 11, Jun. 1, 2001, pp. 6943-6945.
K. Bussman et al., "CPP Giant Magnetoresistance of NiFeCo/Cu/-CoFe/Cu Multilayers," IEEE Trans. on Magnetics, vol. 34, No. 4, Jul. 1998, pp. 924-926.
JJM Ruigrok et al., Disk Recording Beyond 100 Gb/in Squared: Hybrid Recording?(Invited), Journal of Applied Physics, vol. 87, No. 9, May 1, 2000, pp. 5398-5403.
P. Seneor et al., "Large Magnetoresistance in Tunnel Junctions with an Iron Oxide Electrode," Applied Physics Letters, vol. 74, No. 26, Jun. 28, 1999, pp. 4017-4019.

(Continued)

*Primary Examiner*—George Letscher
(74) *Attorney, Agent, or Firm*—George O. Saile; Stephen B. Ackerman

(57) ABSTRACT

Nano-oxide based current-perpendicular-to-plane (CPP) magnetoresistive (MR) sensor stacks are provided, together with methods for forming such stacks. Such stacks have increased resistance and enhanced magnetoresistive properties relative to CPP stacks made entirely of metallic layers. Said enhanced properties are provided by the insertion of magnetic nano-oxide layers between ferromagnetic layers and non-magnetic spacer layers, whereby said nano-oxide layers increase resistance and exhibit spin filtering properties. CPP sensor stacks of various types are provided, all having nano-oxide layers formed therein, including the spin-valve type and the synthetic antiferromagnetic pinned layer spin-valve type. Said stacks can also be formed upon each other to provide laminated stacks of different types.

10 Claims, 9 Drawing Sheets

OTHER PUBLICATIONS

Akira Yanase et al., "Band Structure in the High Temperature Phase of Fe3O4," Journal of the Physical Society of Japan, vol. 53, No. 1, Jan. 1984, pp. 312-317.

Ze Zhang et al., "Electron States, Magnetism, and the Verwey Transition in Magnetite," Physical Review B, vol. 44, No. 24, Dec. 15, 1991—II, pp. 11 319-13 331.

* cited by examiner

MULTILAYERED STRUCTURES COMPRISING MAGNETIC NANO-OXIDE LAYERS FOR CURRENT PERPENDICULAR TO PLANE GMR HEADS

This is a division of patent application Ser. No. 09/953,539 filing date Sep. 17, 2001, now U.S. Pat. No. 6,888,703, Multilayered Structures Comprising Magnetic Nano-Oxide Layers For Current Perpendicular To Plane GMR Heads, assigned to the same assignee as the present invention, which is herein incorporated by reference in its entirety.

BACKGROUND OF THE INVENTION

1. Field of the Invention

This invention relates generally to the fabrication of giant magnetoresistive (GMR) magnetic field sensors of a "current-perpendicular-to-the-plane" (CPP) configuration and more particularly to such sensors having novel multilayer structures that incorporate magnetic nano-oxide layers.

2. Description of the Related Art

Magnetic read sensors that utilize the giant magnetoresistive (GMR) effect for their operation are generally of the "current-in-the-plane" (CIP) configuration, wherein current is fed into the structure by leads that are laterally disposed to either side of the active sensor region and moves through the structure essentially within the planes of its magnetic layers. Since the operation of GMR sensors depends on resistance variations of the active magnetic layers caused by changes in the relative directions of their magnetic moments, it is important that a substantial portion of the current pass through those layers so that their resistance variations can have a maximal effect. Unfortunately, GMR sensor configurations typically involve layer stacks comprising layers that are electrically conductive but that play no role in providing resistance variations. As a result, portions of the current can be shunted through regions that are ineffective in terms of sensor operation and, thereby, the overall sensitivity of the sensor is adversely affected. The CPP sensor configuration avoids this current shunting problem by disposing its conducting leads vertically above and below the active sensor stack, so that all of the current passes perpendicularly through all of the layers as it goes from the lower to the upper lead. The configuration of the conducting leads is such that the current goes through the leads, front to back, in opposite directions in each lead but perpendicularly to the ABS of the sensor element, then passes vertically through all layers of the sensor and perpendicularly through their interfacial planes. Dykes et al. (U.S. Pat. No. 5,668,688) disclose a CPP sensor that is generally structured in a spin-valve (SV) configuration and achieves an enhanced AR/R as compared with a CIP sensor of similar configuration. The CPP sensor of Dykes essentially consists of an SV stack comprising a pinning layer, a ferromagnetic pinned layer, and a ferromagnetic free layer, with the three being sandwiched between conducting leads.

Barr et al. (U.S. Pat. No. 6,198,609) addresses certain current flow problems that persist even in the CPP design. In particular, even though a substantial portion of the current goes through each layer of the sensor element because of the over and under disposition of its leads, a portion of the current can still be shunted along edge paths that define the lateral width of the element. The method taught by Barr et al. forms a CPP sensor element having apertures to guide the current so as to substantially reduce these disadvantageous edge effects.

The magnetic tunnel junction (MTJ) is a device that is usable as a magnetic field sensor or as a memory cell in a magnetic random access memory (MRAM) array. The operating principle of the MTJ is quite similar to that of the CPP sensor formed in a spin valve configuration. In the MTJ device, two ferromagnetic layers are separated by a contiguous insulating tunnel barrier layer. One ferromagnetic layer has its magnetic moment fixed spatially by an antiferromagnetic layer that is interfacially coupled to it. The other ferromagnetic layer, the "free" layer, has its magnetization vector free to move. The relative positions of the two magnetization vectors then controls the amount of tunneling current that can pass through the insulating tunnel barrier layer. In an MRAM array, such an MTJ structure would be "written" by rotating the magnetization direction of its free layer to some given position relative to the magnetically fixed layer. Gallagher et al. (U.S. Pat. No. 5,650,958) provide such a MTJ structure formed with $Ni_{81}Fe_{19}$ layers as the pinned and free ferromagnetic layers, a $Mn_{50}Fe_{50}$ layer as the antiferromagnetic layer and $Al_2O_3$ layer as the insulating tunnel layer. Dill et al. (U.S. Pat. No. 5,898,548) teach a method of forming a magnetic read head using a similar MTJ element as a read sensor. Nishimura (U.S. Pat. No. 6,111,784) teaches a method of forming an MTJ structure for use as a magnetic thin film memory, wherein the MTJ structure comprises a first magnetic layer, a non-magnetic, partially insulating tunneling layer and a second magnetic layer, the two magnetic layers having different coercivities. Finally, Lubitz, et al. (U.S. Pat. No. 6,171,693) teaches a method of forming a GMR stack having at least two ferromagnetic layers separated from each other by a nonferromagnetic layer, wherein a layer of phase-breaking material such as Ta or a Ta-alloy between the ferromagnetic layer and the nonferromagnetic layer prevents the undesirable growth of large-grained structures in the ferromagnetic layers.

One problem with CPP sensor configurations has already been alluded to above, the undesirable shunting of current along the edges of the active sensor region. Another more general problem of even greater importance is the difficulty of fabricating a CPP sensor element having a resistance within reasonable bounds for practical applications. In this regard, CPP structures formed of metallic multilayers, such as those cited in the patents above, have too low a resistance, whereas MTJ type configurations, having insulating tunneling layers, have too high a resistance. Taking as a figure of merit RA, the product of perpendicular-to-plane sensor resistance, R, and cross-sectional area, A, it is found that metallic multilayers typically have RA between 1 $m\Omega.\mu m^2$ (1 milli-ohm micron squared) and 5 $m\Omega.\mu m^2$, while MTJ type configurations typically have RA=10 $\Omega$. $\mu m^2$ or more. The RA value of the metallic multilayers can vary to some degree with the materials used for the layers, the layer thicknesses and the number of repeated layers. Nevertheless, for reading high-density magnetic recordings (above 200 $Gbit/in^2$), the thickness of the sensor is limited by the need to resolve magnetic flux transitions, so it is not possible to increase RA meaningfully by increasing thickness. For an area, A, within usable value of about 0.01 $\mu m^2$, the CPP resistance is about 0.1 $\Omega$, which is too low for practical purposes. MTJ's have also been considered as possible sensor structures, since large MR amplitudes of up to 40% at room temperature have been reported. In these junctions, as in the magnetic multilayers, the perpendicular resistance, R, varies inversely with the area of the junction, A. Evaluation of the signal-to-noise ratio in MTJ read heads has shown that such heads can compete with CIP sensor heads only if the AR product can be reduced to below 5 $\Omega.\mu m^2$.

Such low resistance is difficult to attain in MTJ structures. Since the resistance of such junctions varies exponentially with junction thickness, an Alumina tunnel layer (such as that in Gallagher et al., above) would have to have a thickness of less than 5 angstroms to achieve the requisite RA value. Such a thin layer would introduce the problems of pinholes or general reliability over typical us age periods.

Therefore a need arises for a structure having a value of RA that is intermediate between that of metallic multilayered CPP configurations and MTJ type configurations.

SUMMARY OF THE INVENTION

Accordingly, it is a first object of this invention is to provide a novel current-perpendicular-to-plane (CPP) magnetoresistive (MR) read-sensor stack structure having a product, RA, of perpendicular resistance, R, and cross-sectional area, A, which falls between values of RA provided by metallic multilayer CPP structures and magnetic tunnel junction (MTJ) structures used as read-sensors.

It is, therefore, a second object of this invention to provide a novel CPP MR read-sensor stack structure having a resistance of the order of 10 to 20 Ω for a sensor of area of 0.01 $\mu m^2$ implying a product, RA, of 0.1 $\Omega.\mu m^2$.

It is a further object of this invention to provide such a novel CPP MR read-sensor stack structure that has enhanced magnetoresistive properties.

It is a further object of this invention to provide such novel CPP MR read-sensor stacks in various stack configurations, including such configurations as multiple free layer structures, spin-valve structures and synthetic antiferromagnetic structures.

It is yet a further object of the present invention to provide such novel CPP MR read-sensor stacks in the form of unit cells which can be combined as sequences of identical units or of different units.

It is still a further object of the present invention to provide such novel CPP MR read sensor stacks that can be incorporated into magnetic read heads that embody the advantageous properties of said stacks.

It is yet a further object of the present invention to provide methods for forming each of the above read-sensor stacks.

In accord with the objects of this invention there are provided methods for forming multi-layered magnetic stack structures and the structures so formed, in which ferromagnetic metallic layers are alternated with non-magnetic metallic spacer layers and wherein magnetic nano-oxide (MO} layers such as $Fe_3O_4$ or $CrO_2$, CoFeNi based spinel structures, ferrimagnetic garnets, manganites or other ferromagnetic perovskites, or ferromagnetic nitrides, are inserted at the interfaces of the ferromagnetic and non-magnetic layers or placed within the bulk of the metallic ferromagnetic layers. Said magnetic nano-oxide layers provide both an increased resistive path for conduction electrons and resistively differentiate between spin up and spin down electrons, thereby enhancing the magnetoresistive properties of the stack. Further in accord with the objects of this invention, the only oxide or nitride layers present in the stack must be magnetic, eg., ferrimagnetic or ferromagnetic. If other non-magnetic oxide layers are present, such layers must exhibit material discontinuities, eg., pinholes or other openings through which electrical charges can easily flow. Further it is the role of the non-magnetic metallic spacer layers to permit sufficient separation of the magnetic layers so that relative motion of their magnetic moments is allowed. Yet further in accord with the objects of this invention, the thickness of the MO layers is preferentially within the range between 0.2 nanometers (nm) and 6 nm and if two MO layers of the same material are used, their thicknesses are preferably chosen to be equal. Further yet in accord with the objects of this invention, the MO layers may or may not be exchange coupled to the ferromagnetic metal layers. If they are so coupled, they can be located within the bulk of the ferromagnetic layer or, preferably, located at the interface of the non-magnetic spacer layer to reduce the separation between successive MO layers as much as possible. Still further in accord with the objects of this invention the multilayered stack structures can be configured according to different schemes and modalities whereby, for example, a plurality of ferromagnetic layers may be free layers, a plurality of ferromagnetic layers can be pinned by exchange coupling to antiferromagnetic layers, a plurality of ferromagnetic layers can be separated by MO layers and antiferromagnetically coupled to each other and to antiferromagnetic layers and a plurality of MO layers can themselves serve as pinned layers. Yet further in accord with the objects of this invention, identical stack formations may be replicated and connected in series or different stack configurations can be formed in series to produce new variations thereby. Finally, in accord with the objects of this invention, said stack configurations can be incorporated into read-heads and into read-write head merged combinations by providing them with appropriate conducting lead structures and magnetic bias layers.

BRIEF DESCRIPTION OF THE DRAWINGS

The objects, features and advantages of the present invention are understood within the context of the Description of the Preferred Embodiments, as set forth below. The Description of the Preferred Embodiments, is understood within the context of the accompanying figure, wherein.

DESCRIPTION OF THE PREFERRED EMBODIMENTS

The present invention provides a variety of CPP MR layered sensor stack configurations and methods for fabricating them, wherein said configurations exhibit a large giant magnetoresistive (GMR) amplitude ($\alpha R/R$) and have a product of perpendicular resistance, R and cross-sectional area, A, that falls between that of metallic layered CPP sensor stacks and MTJ devices. The stack formations comprise alternating layers of metallic ferromagnetic materials, non-magnetic metallic spacer layers, and a variety of thin, nano-layers of magnetic oxides, manganites, CoFeNi based spinel structures, ferrimagnetic garnets, manganites, or other ferromagnetic perovskites and ferromagnetic nitrides. For simplicity of the following descriptions, these nano-layers will be denoted collectively and with equal meaning as "magnetic nano-oxide layers" or, for brevity, (MO) layers.

Figure 1A:
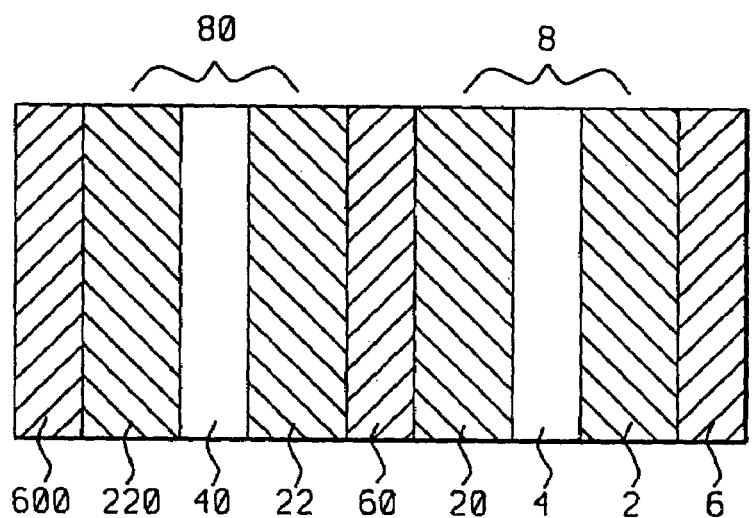
FIG. 1a–d provides a schematic cross-sectional representation of the stack configuration of a first preferred embodiment along with a sequence depicting the process steps by which it is formed.

Referring first to FIG. 1a, there is seen a schematic cross-sectional diagram of the first embodiment of a sensor stack formed in accord with the methods and objects of the present invention and wherein magnetic nano-oxide layers (4) and (40) are inserted between ferromagnetic layers (2), (20), (22) and (220) to form two magnetic tri-layers (8) and (80). Non-magnetic spacer layers (6), (60) and (600) separate the magnetic layers from each other and from upper and lower substrates (not shown).

Figure 1B:
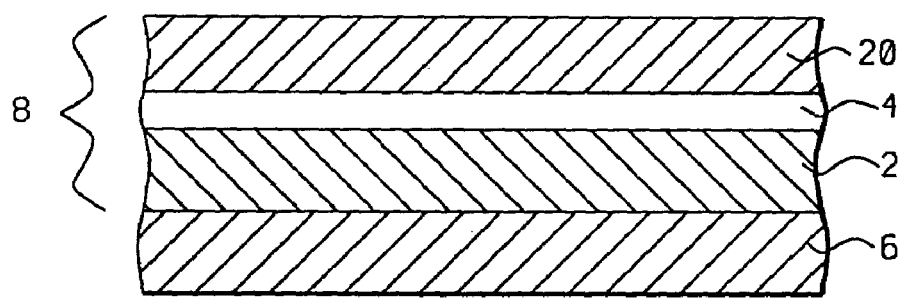

Referring next to FIG. 1b, there is shown a schematic cross-sectional diagram of an initial step in the formation of the sensor stack of FIG. 1a. There is first formed on an appropriate substrate (not shown) a first metallic, non-magnetic spacer layer (6). All metallic, non-magnetic spacer layers formed in this embodiment and in the embodiments to be described in FIGS. 2, 3, 4, and 5, can be layers of material such as Cu, Au or Ag and can be formed to a thickness of between 0.5 nm and 10 nm. Upon the spacer layer (6), there is then formed a first magnetic tri-layer (8), comprising two ferromagnetic layers (2) and (20), separated by a magnetic nano-oxide layer (4). In this embodiment and in the embodiments to follow, the ferromagnetic layers can be layers of ferromagnetic transition metal alloys, preferably $Ni_{80}Fe_{20}$, or $Co_{90}Fe_{10}$, formed to a thickness of between 0.5 nm and 5.0 nm and the magnetic nano-oxide layers are layers of material such as $Fe_3O_4$ or $CrO_2$, CoFeNi based spinel structures, ferrimagnetic garnets, manganites or other ferromagnetic perovskites, or ferromagnetic nitrides and are formed to a thickness of between 0.4 nm and 6.0 nm.

Other possible nano-oxide materials that meet the objects and methods of this invention are the nano-oxide layers formed by surface oxidation of NiFe or CoFe. The thickness of the magnetic nano-oxide layers must be sufficiently thin so as to avoid producing the high resistances encountered in magnetic tunnel junctions, yet thick enough to avoid pinholes. It is the advantageous role of these magnetic nano-oxide layers that they both increase the perpendicular resistance of the stack formation as is desired and, at the same time, differentiate resistively between spin up and spin down (relative to magnetizations) electrons, thereby improving the magnetoresistive effects of the layered structures. In this particular embodiment the magnetic nano-oxide layers (4) and (40) are strongly coupled to their two surrounding ferromagnetic layers (2) and (20) and (22) and (220), so that the overall magnetic behavior of the stack is that of a soft (low coercivity) magnetic material. In this embodiment the magnetic moments of both ferromagnet/nano-oxide/ferromagnet tri-layers (8) and (80) are free to rotate as a function of an applied external field, such as that of a magnetic storage medium. When the stack of this embodiment is incorporated within a complete read head structure, the two tri-layers would be coupled so that their magnetic moments were in an antiparallel alignment. In such a design, the alignment is stabilized by magnetostatic fields at the edges of the stack. If the stack has a square shape, the magnetic moments will tend to lie along the diagonals of the square. Typically, a bias field is applied by laterally disposed permanent (hard) magnetic biasing layers, so that the magnetic moments are at 90° to each other in their quiescent state. In operation, the external fields produced by magnetic storage media will rotate the alignment from the quiescent configuration to either parallel or antiparallel alignments depending upon whether the external field is positive or negative.

Figure 1C:
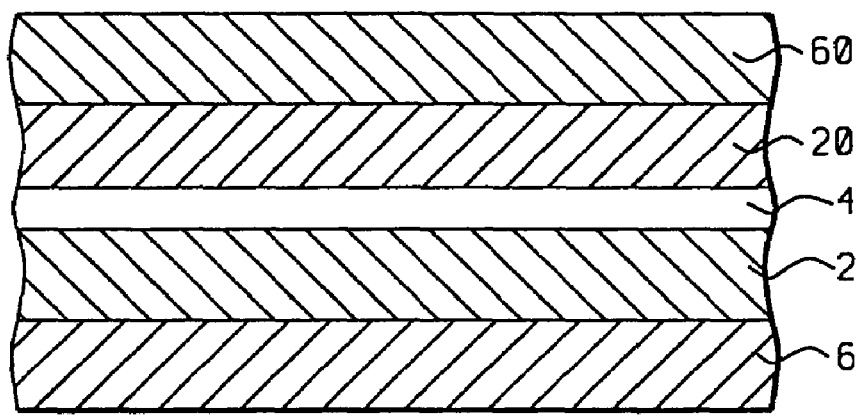

Referring next to FIG. 1c, there is shown the formation of FIG. 1b on which has been additionally formed a second non-magnetic spacer layer (60), to separate the two magnetic tri-layers in this embodiment from each other. Said layer is formed of metallic, non-magnetic materials such as Cu, Au or Ag and can be formed to a thickness of between 0.5 nm and 10 nm.

Figure 1D:
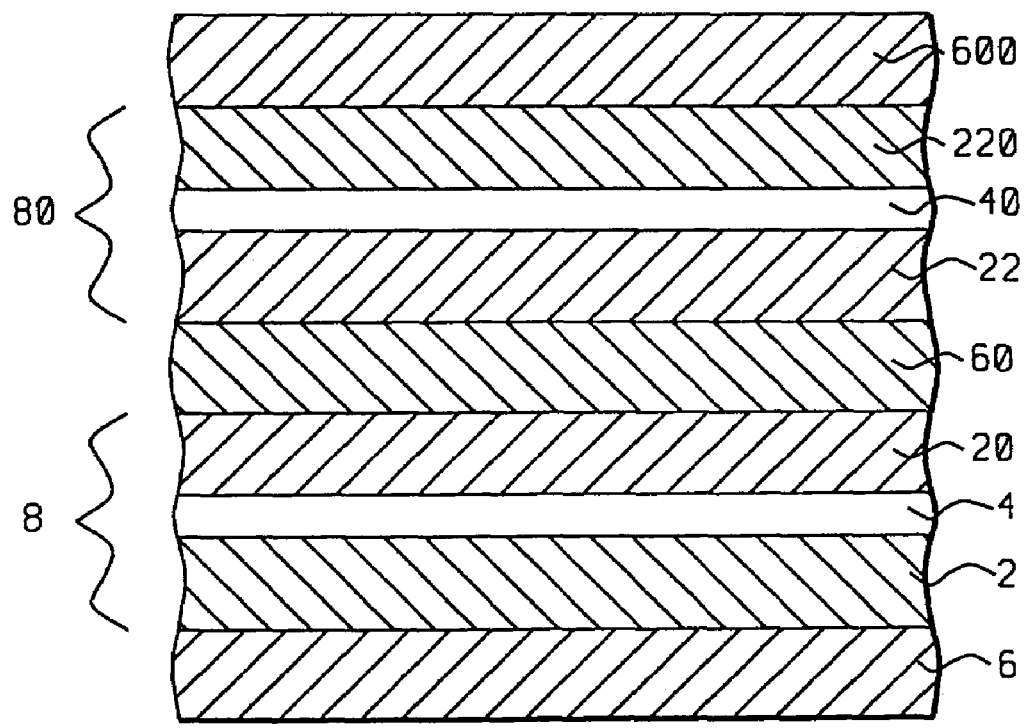

Finally, referring next to FIG. 1d, there is shown the formation of FIG. 1c on which has been additionally formed a second magnetic tri-layer (80), comprising the formation of two ferromagnetic layers (22) and (220), separated by a magnetic nano-oxide layer (40). Said ferromagnetic layers can be layers of ferromagnetic transition metal alloys, preferably $Ni_{80}Fe_{20}$, or $Co_{90}Fe_{10}$, formed to a thickness of between 0.5 nm and 5.0 nm and said magnetic nano-oxide layer is a layer of material such as $Fe_3O_4$ or $CrO_2$, CoFeNi based spinel structures, ferrimagnetic garnets, manganites or other ferromagnetic perovskites, or ferromagnetic nitrides and are formed to a thickness of between 0.4 nm and 6.0 nm. There is then formed over the tri-layer a spacer layer (600) of a non-magnetic material such as Cu, Au or Ag and can be formed to a thickness of between 0.5 nm and 10 nm.

Figure 2A:
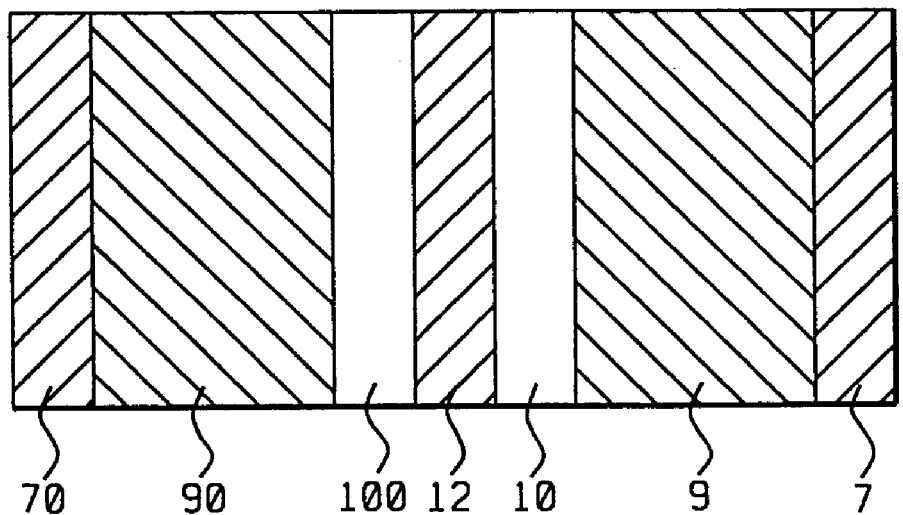
FIGS. 2a–d provides a schematic cross-sectional representation of the stack configuration of a second preferred embodiment along with a sequence depicting the process steps by which it is formed.

Referring now to FIG. 2a, there is shown a schematic cross-sectional representation of a sensor stack formed in accord with a second embodiment of the present invention. The stack of this embodiment is a CPP stack that differs structurally from that of FIG. 1a by the positioning of the its magnetic nano-oxide layers (10) and (100), which are now at the interfaces of the ferromagnetic layers (9) and (90) (rather than within the body of the ferromagnetic layer) and separated by a non-magnetic metallic spacer layer (12). The dimensions and material compositions of the layers will be discussed below in the context of their formations. It should be noted that the thickness of each ferromagnetic layer (9) and (90) is preferably equal to the sum of the thicknesses of the two ferromagnetic layers (2) and (20) and (22) and (220), in FIG. 1a.

The performance characteristics of this stack exceed those of the stack in FIG. 1a for the following reason. In order to obtain a large GMR amplitude, it is important that the electrons retain their spin direction in passing between the two ferromagnetic layers. The spin flip diffusion length for electrons in $Ni_{80}Fe_{20}$ is known to be 5.5 nm, whereas in non-magnetic substances, such as those used in the spacer layers, the spin flip diffusion length is several tens of nanometers. In the structure of FIG. 1a, therefore, electrons must pass between a greater thickness than that of $Ni_{80}Fe_{20}$ as they pass between the two tri-layers, whereas in the structure of FIG. 2a, electrons pass only through the non-magnetic layer (12) as they go from one ferromagnetic layer to the other. Therefore, the probability of a spin flip is greatly reduced in the structure of FIG. 2a and the magnetoresistive effect is more pronounced.

Figure 2B:
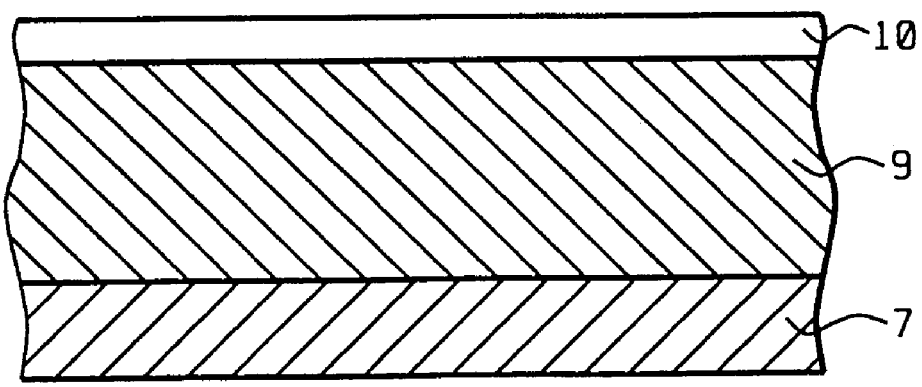
Figure 2C:
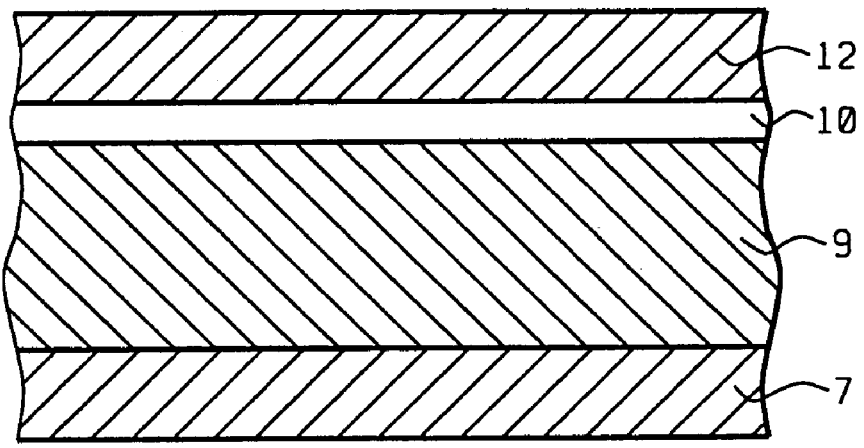
Figure 2D:
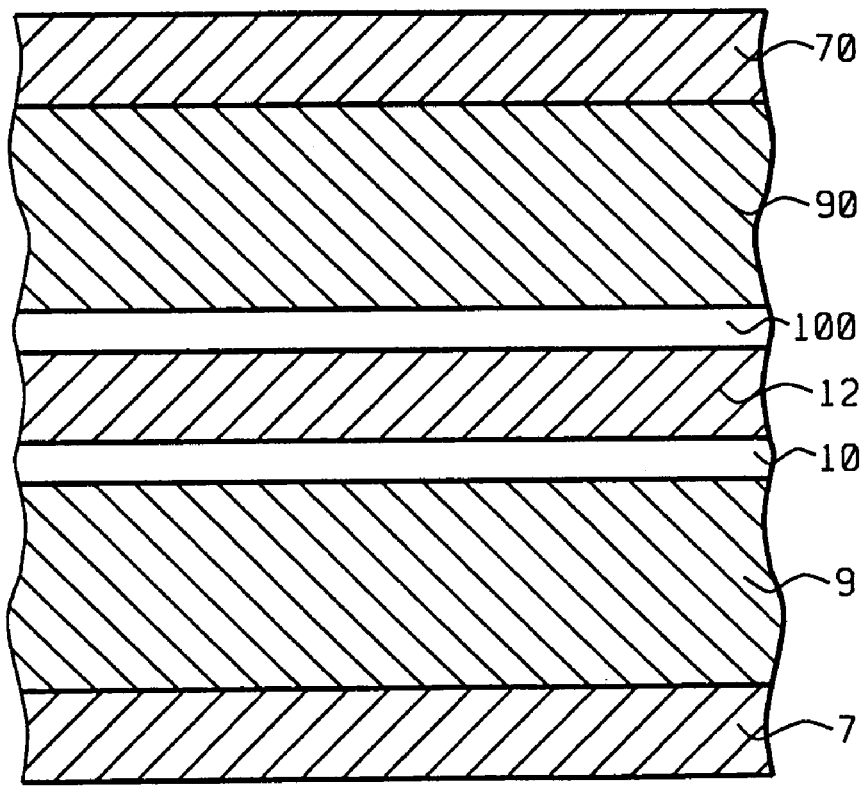

Referring next to FIGS. 2b–d, there is shown the schematic diagrams of a succession of steps leading to the formation of the stack of FIG. 2a. Referring first to FIG. 2b, there is shown a first non-magnetic layer (7) on which has been formed a first ferromagnetic layer (9). The non-magnetic layer is a layer of a non-magnetic material such as Cu, Au or Ag and can be formed to a thickness of between 0.5 nm and 10 nm. Said ferromagnetic layer can be a layer of ferromagnetic transition metal alloy, preferably $Ni_{80}Fe_{20}$, or $Co_{90}Fe_{10}$, formed to a thickness of between 0.5 nm and 5.0 nm.

On the ferromagnetic layer (9), is then formed a first magnetic nano-oxide layer (10), wherein said magnetic nano-oxide layer is a layer of material such as $Fe_3O_4$ or $CrO_2$, CoFeNi based spinel structures, ferrimagnetic garnets, manganites or other ferromagnetic perovskites, or ferromagnetic nitrides and are formed to a thickness of between 0.4 nm and 6.0 nm. of a non-magnetic material such as Cu, Au or Ag and can be formed to a thickness of between 0.5 nm and 10 nm.

Referring next to FIG. 2c, there is shown the fabrication of FIG. 2b, wherein a second non-magnetic spacer layer (12) has been formed on the magnetic nano-oxide layer (10). The non-magnetic layer is a layer of a non-magnetic material such as Cu, Au or Ag and can be formed to a thickness of between 0.5 nm and 10 nm.

Referring finally to FIG. 2d, there is shown the fabrication of FIG. 2c on which has now been formed a second magnetic nano-oxide layer (100) on the second non-magnetic layer (12). Said magnetic nano-oxide layer is a layer of material such as $Fe_3O_4$ or $CrO_2$, CoFeNi based spinel structures, ferrimagnetic garnets, manganites or other ferromagnetic perovskites, or ferromagnetic nitrides and are formed to a thickness of between 0.4 nm and 6.0 nm.

A second ferromagnetic layer (90) is then formed on the second magnetic nano-oxide layer and a third non-magnetic spacer layer (70) is formed to complete the stack. Said ferromagnetic layer can be a layer of ferromagnetic transition metal alloy, preferably $Ni_{80}Fe_{20}$, or $Co_{90}Fe_{10}$, formed to a thickness of between 0.5 nm and 5.0 nm and the spacer layer is formed of a non-magnetic material such as Cu, Au or Ag and can be formed to a thickness of between 0.5 nm and 10 nm.

Figure 3A:
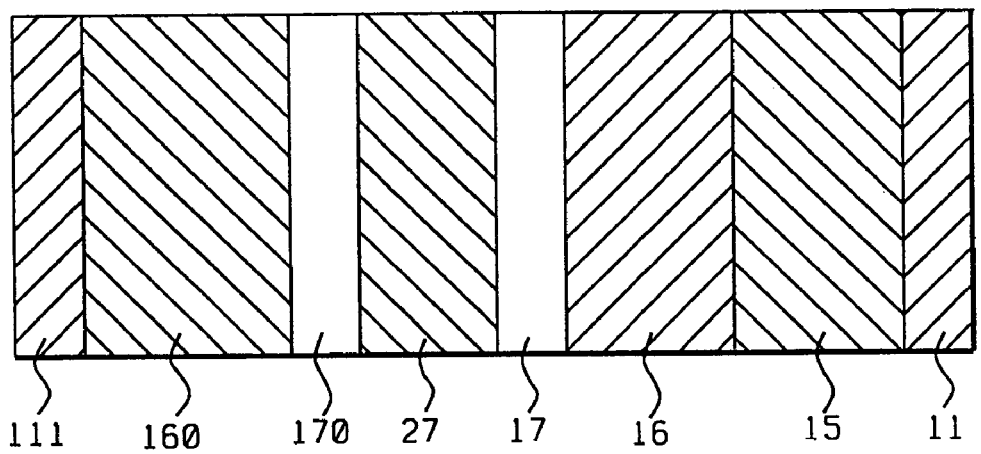
FIGS. 3a–d provides a schematic cross-sectional representation of the stack configuration of a third preferred embodiment along with a sequence depicting the process steps by which it is formed.

Referring next to FIG. 3a, there is shown a third embodiment of the present invention, a stack configuration in which one of the ferromagnetic layers (16) is exchange biased (pinned) by an antiferromagnetic layer (15). In this case the antiferromagnetic layer would be a layer of antiferromagnetic material chosen from the group consisting of MnPt, NiMn, IrMn, CrMnPt and MnPtPd, and deposited to a thickness of between 5 nm and 30 nm. The magnetization of the remaining ferromagnetic layer (160) is free to move; thus, layer (160) is a ferromagnetically free layer.

In prior art CPP spin-valves structures it has been observed that the use of an antiferromagnetic pinning layer leads to a decrease of GMR amplitude. This is not the case in the present embodiment, however, since the resistance is dominated by the magnetic nano-oxide layers. Adding the resistance of an antiferromagnetic layer in series is not going to affect the resistance appreciably. This structure, therefore, comprises only one soft layer, the free (unpinned) layer, which is unlike either of the structures of FIGS. 1a and 1b, which comprise two ferromagnetic layers. If the structure of FIG. 3a is used in producing a read head sensor, the magnetization of the pinned layer would be set in the direction of the field to be measured, whereas the free layer would be biased so that it is at a 90° angle to the pinned layer when in the quiescent state.

Figure 3B:
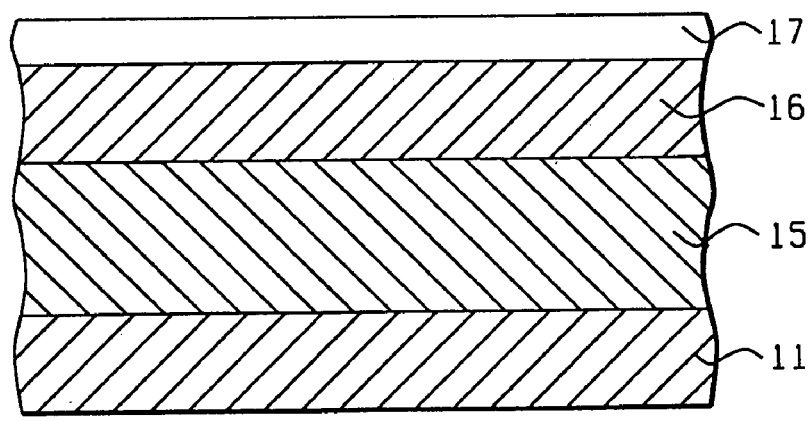

Referring next to FIG. 3b, there is shown a schematic cross-sectional view of the early stages of the formation of the stack of FIG. 3a. There is shown a first metallic, non-magnetic layer (11), formed of material such as Cu, Au or Ag and formed to a thickness of between 0.5 nm and 10 nm. On this layer is formed an antiferromagnetic layer (15), a layer of antiferromagnetic material chosen from the group consisting of MnPt, NiMn, IrMn, CrMnPt and MnPtPd, and deposited to a thickness of between 5 nm and 30 nm. On the antiferromagnetic layer is then formed a ferromagnetic pinned layer (16), preferably a layer of $Ni_{80}Fe_{20}$, or $Co_{90}Fe_{10}$, formed to a thickness of between 0.5 nm and 5.0 nm. On the ferromagnetic pinned layer is formed a first magnetic nano-oxide layer (17), a layer of material such as $Fe_3O_4$ or $CrO_2$, surface oxidations of NiFe or CoFe, CoFeNi based spinel structures, ferrimagnetic garnets, manganites or other ferromagnetic perovskites, or ferromagnetic nitrides and are formed to a thickness of between 0.4 nm and 6.0 nm.

Figure 3C:
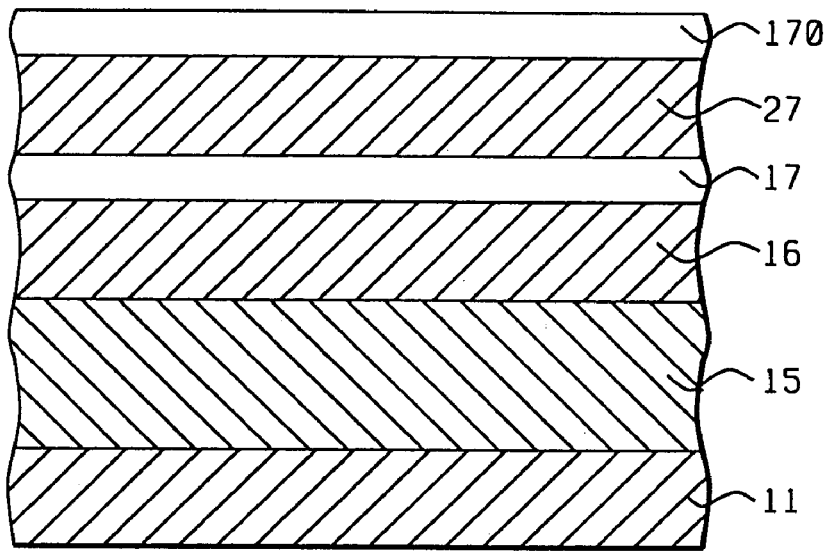

Referring next to FIG. 3c, there is shown a continuation of the process of FIG. 3b, wherein a metallic, second non-magnetic spacer layer (27), is formed on the first magnetic nano-oxide layer (17). The second metallic, non-magnetic spacer layer is formed of material such as Cu, Au or Ag and formed to a thickness of between 0.5 nm and 10 nm. A second magnetic nano-oxide layer (170) is formed on the spacer layer, said nano-oxide layer being formed of material such as $Fe_3O_4$ or $CrO_2$, surface oxidations of NiFe or CoFe, CoFeNi based spinel structures, ferrimagnetic garnets, manganites or other ferromagnetic perovskites, or ferromagnetic nitrides and being formed to a thickness of between 0.4 nm and 6.0 nm.

Figure 3D:
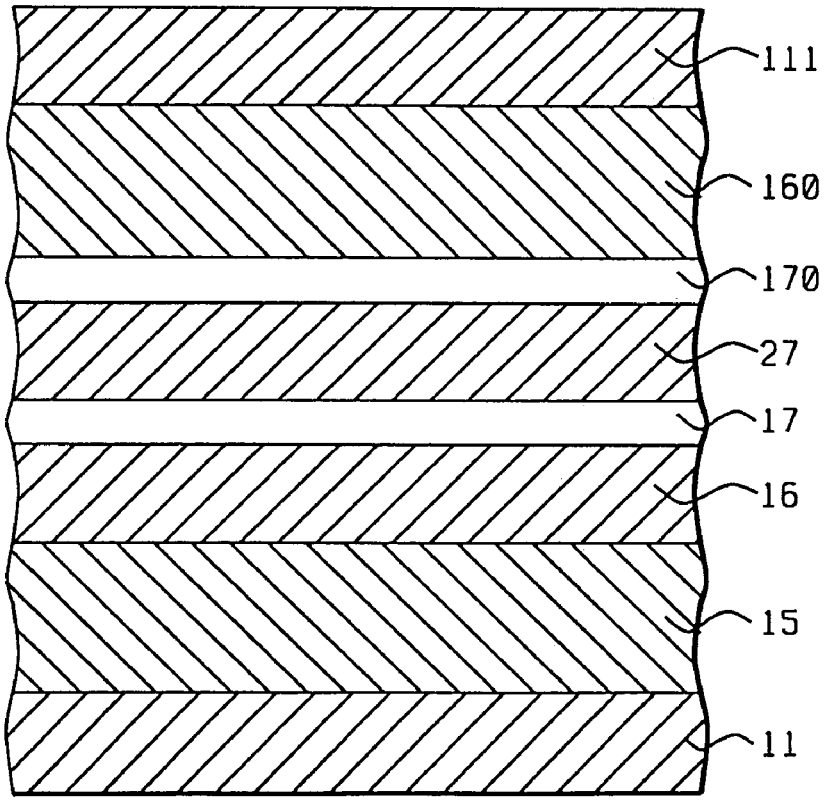

Referring finally to FIG. 3d, there is shown the completion of the formation process wherein a ferromagnetic free layer (160) is formed on the nano-oxide layer, said layer being preferably a layer of $Ni_{80}Fe_{20}$, or $Co_{90}Fe_{10}$ formed to a thickness of between 0.5 nm and 5.0 nm. Finally, a metallic, non-magnetic layer (111) is formed on the ferromagnetic free layer, said non-magnetic spacer layer being formed of material such as Cu, Au or Ag and formed to a thickness of between 0.5 nm.

Figure 4A:
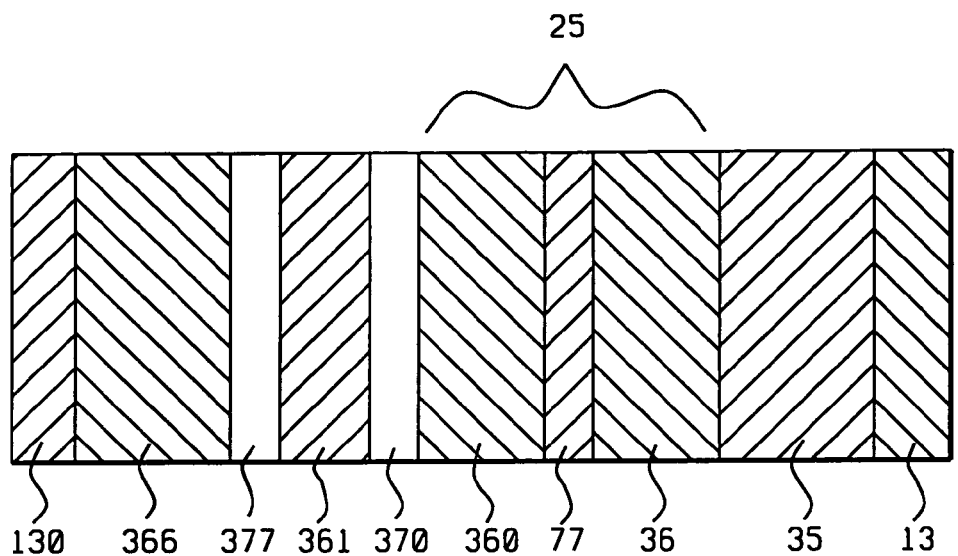
FIGS. 4a–d provides a schematic cross-sectional representation of the stack configuration of a fourth preferred embodiment along with a sequence depicting the process steps by which it is formed.

Referring next to FIG. 4a, there is shown a completed CPP stack structured in a spin-valve configuration with a synthetic pinned (SyAP) layer and fabricated in accord with the present invention. The various elements of the structure will be referred to in the context of the following three figures, 4b, 4c and 4d, describing the formation of the structure.

Figure 4B:
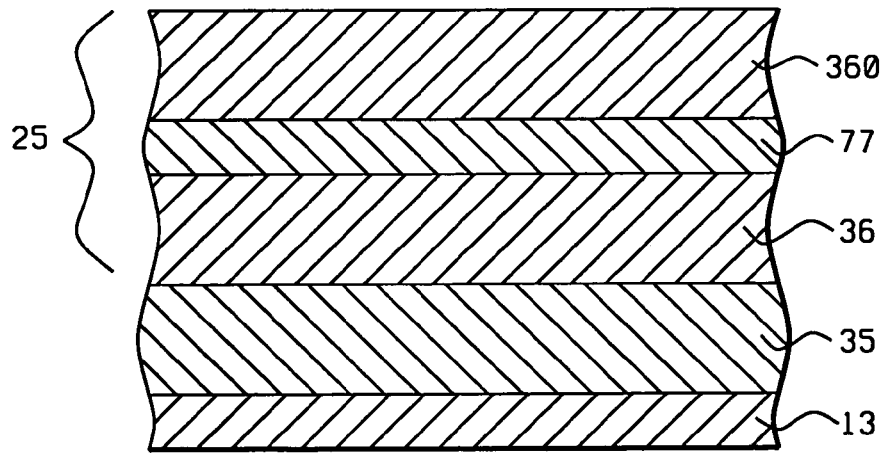

Referring next to FIG. 4b, there is schematically shown the initial stage of the formation of the stack of FIG. 4a. First a layer of non-magnetic metallic material (13) is formed of material such as Cu, Au or Ag to a thickness of between 0.5 nm and 10 nm. A layer of antiferromagnetic material (35), which will serve to pin the synthetic antiferromagnetic pinned layer, is then formed on the non-magnetic layer. The layer of antiferromagnetic material is chosen from the group consisting of MnPt, NiMn, IrMn, CrMnPt and MnPtPd, and deposited to a thickness of between 5 nm and 30 nm. A synthetic pinned antiferromagnetic (SyAP) tri-layer (25) is then formed by strongly coupling two ferromagnetic layers, (36) and (360) across a thin antiferromagnetic coupling layer (77). A material selected from the group of metallic, non-magnetic materials consisting of Ru, Rh, and Ir and formed to a thickness of between approximately 0.5 and 1.5 nm can be used to form this antiferromagnetic coupling layer. Said ferromagnetic layers can be layers of ferromagnetic transition metal alloys, preferably $Ni_{80}Fe_{20}$, or $Co_{90}Fe_{10}$, formed to a thickness of between 0.5 nm and 5.0 nm. The synthetic antiferromagnetic pinned layer formation (25) described above is analogous to similar formations used in CPP spin-valve structures not fabricated in accord with the methods of the present invention. In all cases, the synthetic layer approach allows the formation of stronger pinning fields. In all-metal multilayer structures not fabricated in accord with the method of the present invention, however, the synthetic scheme would be detrimental to the CPP GMR amplitude. In the present case, however, the MO layers dominate the total stack resistance and the additional in-series resistance of the pinned layer will not adversely affect the GMR amplitude.

Figure 4C:
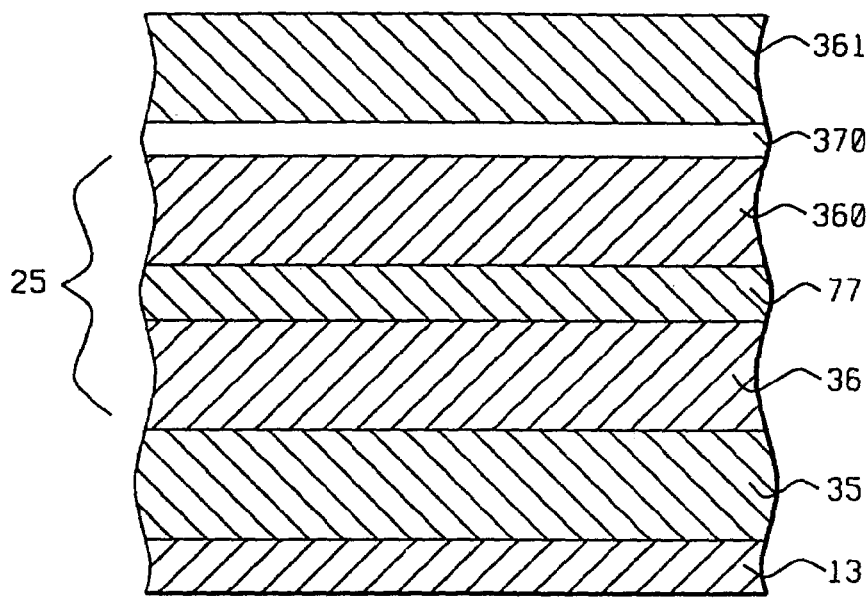

Referring next to FIG. 4c, there is shown the fabrication of FIG. 4b on which a first magnetic nano-oxide layer (370) has now been formed. The layer is formed of material chosen from the group that includes $Fe_3O_4$ or $CrO_2$, surface oxidations of NiFe or CoFe, CoFeNi based spinel structures, ferrimagnetic garnets, manganites or other ferromagnetic perovskites, or ferromagnetic nitrides and it is formed to a thickness of between 0.4 nm and 6.0 nm. On this nano-oxide layer is then formed a second metallic, non-magnetic spacer layer (361), which can be a layer of Cu, Ag or Au formed to a thickness of between 0.5 and 10 nm.

Figure 4D:
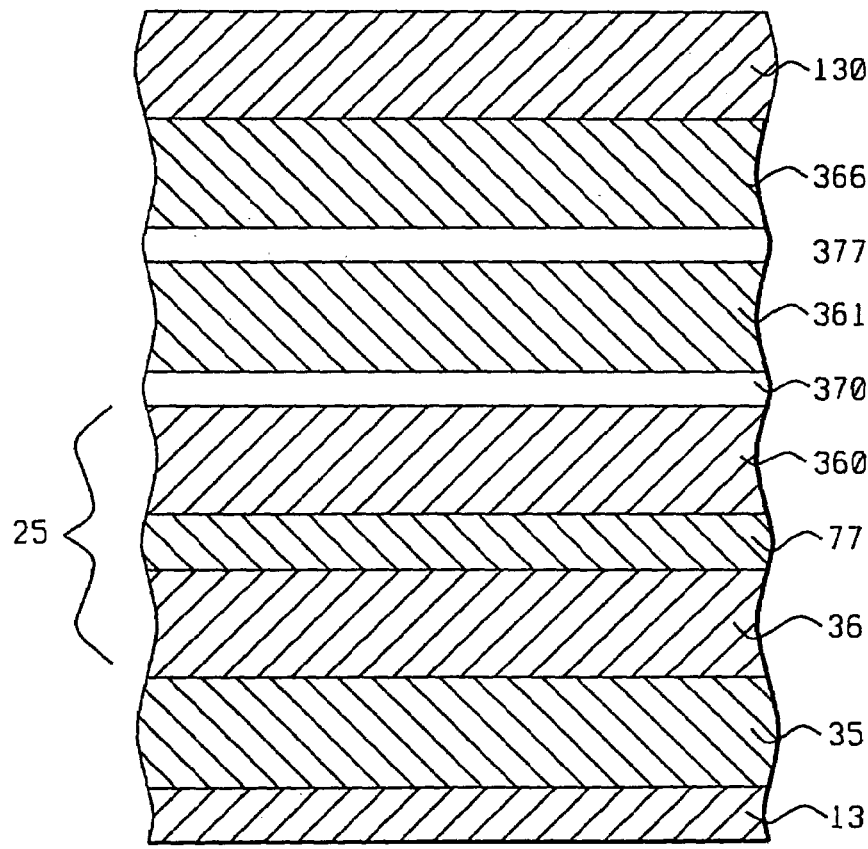

Referring next to FIG. 4d, there is shown the fabrication of FIG. 4c on which a second nano-oxide layer (377) has been formed. The layer is formed of material chosen from the group that includes $Fe_3O_4$ or $CrO_2$, surface oxidations of NiFe or CoFe, CoFeNi based spinel structures, ferrimagnetic garnets, manganites or other ferromagnetic perovskites, or ferromagnetic nitrides and it is formed to a thickness of between 0.4 nm and 6.0 nm. On this nano-oxide layer is then formed the free ferromagnetic layer (366). This ferromagnetic layers can be a layer of ferromagnetic transition metal alloy, preferably $Ni_{80}Fe_{20}$, or $Co_{90}Fe_{10}$, formed to a thickness of between 0.5 nm and 5.0 nm. Finally, on the ferromagnetic free layer there is formed a second metallic, non-magnetic spacer layer (361), which can be a layer of Cu, Ag or Au formed to a thickness of between 0.5 and 10 nm.

Figure 5A:
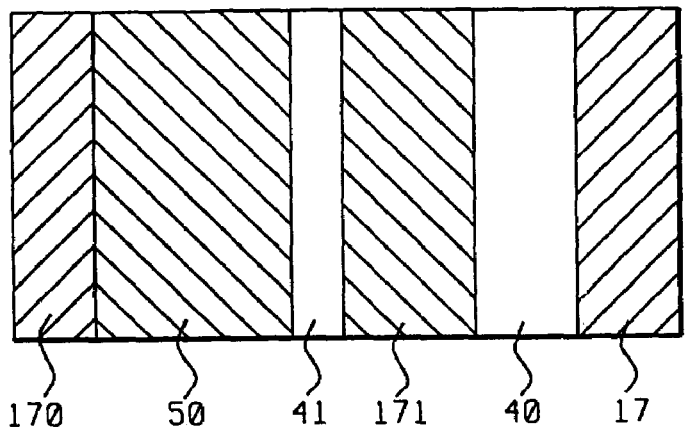
FIGS. 5a–c provides a schematic cross-sectional representation of the stack configuration of a fifth preferred embodiment along with a sequence depicting the process steps by which it is formed.

Referring finally to FIG. 5a, there is shown a schematic representation of a CPP stack formed in accord with the method of the present invention in which one of the magnetic nano-oxide layers (40) is not coupled to any other magnetic material. The two layers (17) and (171) are metallic, non-magnetic layers, such as Cu, Au or Ag. It should be noted that most of the magnetic nano-oxide materials used in forming stacks in accord with the present invention are not magnetically soft (low coercivity) materials. Some are even themselves used as recording media for some applications. Therefore, their pinning energy may be large enough for them to be used alone as pinned layers. The material and dimensions of the layers will now be discussed in the context of the process of forming the stack.

Figure 5B:
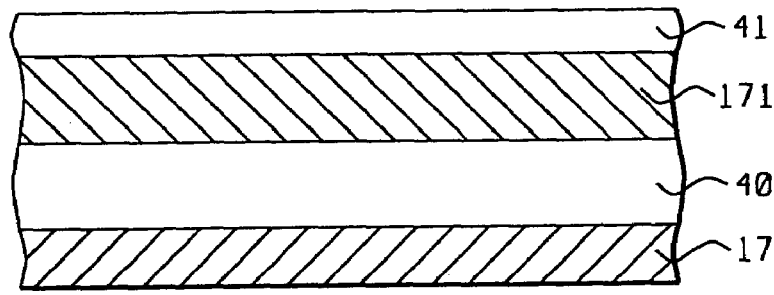

Referring now to FIG. 5b, there is shown a schematic cross-sectional diagram of the beginning steps in the formation of the stack of this embodiment. First, a metallic, non-magnetic layer (17) is formed. This can be a layer of Cu, Ag or Au formed to a thickness of between 0.5 and 10 mm. Next, a layer of magnetic nano-oxide material (40) is formed on the metallic layer. This layer is formed of material chosen from the group that includes $Fe_3O_4$ or $CrO_2$, surface oxidations of NiFe or CoFe, CoFeNi based spinel structures, ferrimagnetic garnets, manganites or other ferromagnetic perovskites, or ferromagnetic nitrides and it is formed to a thickness of between 0.4 nm and 6.0 nm. On this layer is then formed a second metallic, non-magnetic layer (171). This can be a layer of Cu, Ag or Au formed to a thickness of between 0.5 and 10 nm. On this layer is then formed a second magnetic nano-oxide layer (41). Like the first nano-oxide layer (40), this layer is formed of material chosen from the group that includes $Fe_3O_4$ or $CrO_2$, surface oxidations of NiFe or CoFe, CoFeNi based spinel structures, ferrimagnetic garnets, manganites or other ferromagnetic perovskites, or ferromagnetic nitrides and it is formed to a thickness of between 0.4 nm and 6.0 nm.

Figure 5C:
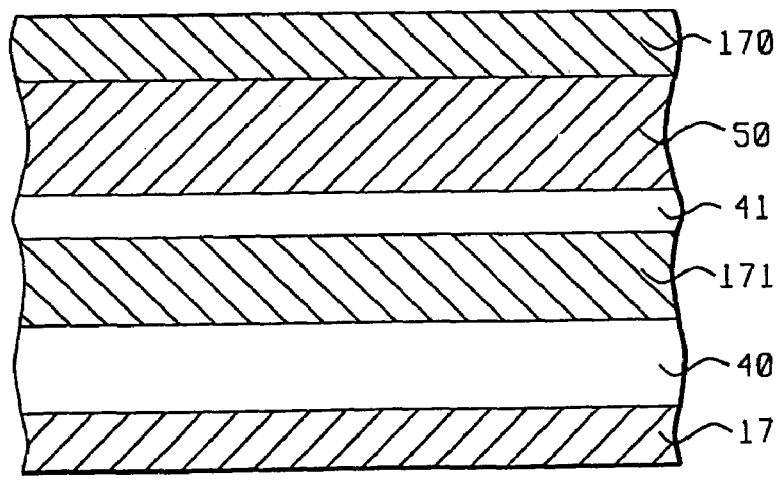

Referring finally to FIG. 5c, there is shown the fabrication in FIG. 5b on which there has now been formed a ferromagnetic layer (50), which can be a layer of ferromagnetic transition metal alloy, preferably $Ni_{80}Fe_{20}$, or $Co_{90}Fe_{10}$, formed to a thickness of between 0.5 nm and 5.0 nm. On this ferromagnetic layer there is then formed a final metallic, non-magnetic layer (170), which can be a layer of Cu, Ag or Au formed to a thickness of between 0.5 and 10 nm.

It is to be recognized that the structures described above in FIGS. 1a, 2a, 3a, 4a, & 5a represent unit cells. Stacks formed in accord with the methods of the present invention may, therefore, comprise repetitions of these cells or combinations of these cells. In addition, the ferromagnetic layers within different cells need not be formed of the same materials nor formed to the same thicknesses.

Finally, it is also to be recognized that the structures formed by the method of the present invention can be formed into read heads by the addition of conducting leads and by the appropriate magnetizations of free and pinned ferromagnetic layers and by the formation of appropriate bias layers. They can also be formed as a part of a merged read/write head by providing an inductive write head on which to form the read head provided herein.

EXAMPLE AND DISCUSSION

An example of expected signal output can be given in terms of a sample sensor stack formed in accord with the embodiment described in FIG. 1b. Let us consider a structure of the following specific composition and dimensions:

Cu 30 A/$Ni_{80}Fe_{20}$30 A/$Fe_3O_4$4 A/Cu 30 A/$Fe_3O_4$4 A/$Ni_{80}Fe_{20}$30 A/Cu 30 A (A=angstroms)

It has been shown that the resistivity of $Fe_3O_4$ is of the order of 16,000 $\mu\Omega$.cm for spin up (spin directed along the layer magnetic moment) electrons and on the order of 620,000 $\mu\Omega$.cm for spin down electrons. The ratio between spin down and spin up resistivities can be even greater if the half-metallic character of $Fe_3O_4$ is maintained. For an area of the CPP MR element of 100 m×100 nm, we can calculate a resistance of 12.5 $\Omega$ using the two-current model and serial network of resistance well known for CPP transport in magnetic multilayers. The MR amplitude is expected to be in the range of several hundred percent. This is the right order of resistance that we seek for CPP MR heads. For an area of 50 m×50 nm, the resistance would be 50 $\Omega$. This resistance can be adjusted by varying the thickness of the magnetic nano-oxide layers.

For a given type of magnetic nano-oxide layer, the largest MR amplitude is obtained when the thicknesses of the two layers is equal (as in the example above). This can be seen as follows. Let the spin up resistance, $R_\square=\alpha R$ for the first magnetic nano-oxide layer and let its spin down resistance be $R_\square=\alpha^{-1}R$. Let us also suppose, for simplicity, that the second layer is made of the same material and has a thickness which is a factor $\gamma$ times that of the first layer. Considering that the resistance of the stack is dominated by these two layers, the resistance in the parallel magnetic configuration is:

$$R_{parallel}=(1+\gamma)(\alpha+\alpha^{-1})R$$

and the resistance in the antiparallel configuration is:

$$R_{antiparallel}=(\alpha+\alpha^{-1}\gamma)(\alpha\gamma+\alpha^{-1})\,(\alpha+\alpha^{-1})^{-1}(1+\gamma)^{-1}R.$$

Thus, the magnetoresistance normalized by the resistance in parallel alignment is given by:

$$\Delta R/R_{parallel}=(\alpha^2+\alpha^{-2}-2)(1+\gamma^2)^{-1}\gamma.$$

This quantity is maximum for $\gamma=1$, i.e. when the two layers have the same thickness. When this condition is satisfied, the maximum MR ratio is given by:

$$\Delta R/R_{parallel} = \tfrac{1}{2}(\alpha^2 + \alpha^{-2}) - 1.$$

This is equal to zero if electron transport through the magnetic nano-oxide layer is not spin dependent ($\alpha=1$), but it can reach very large values if $\alpha$ is far from unity. If the layers are different in material and have different spin up to spin down resistivity ratios, then the optimal relative thickness ratio would not be equal to unity, but could be calculated by the method above.

As is understood by a person skilled in the art, the preferred embodiments of the present invention are illustrative of the present invention rather than limiting of the present invention. Revisions and modifications may be made to methods, materials, structures and dimensions employed in fabricating CPP sensor stacks having magnetic nano-oxide layers, or magnetic read heads comprising such stacks, while still providing a method for fabricating CPP sensor stacks having magnetic nano-oxide layers, or magnetic read heads comprising such stacks in accord with the spirit and scope of the present invention as defined by the appended claims.

What is claimed is:

1. A magnetic nano-oxide based current-perpendicular-to-plane (CPP) magnetoresistive (MR) sensor stack having an antiferromagnetically coupled magnetic nano-oxide layer and having increased perpendicular resistance and enhanced magnetoresistive properties, comprising:
   a substrate;
   a first metallic, non-magnetic spacer layer formed upon said substrate;
   a ferromagnetic layer formed upon said first metallic, non-magnetic spacer layer;
   a first magnetic oxide nano-layer formed upon said ferromagnetic layer;
   a second metallic, non-magnetic spacer layer formed upon said first magnetic oxide nano-layer;
   a second magnetic oxide nano-layer formed upon said second metallic, non-magnetic spacer layer;
   a third metallic, non-magnetic spacer layer formed upon said second metallic, non-magnetic spacer layer.

2. The structure of claim 1 wherein the first, second and third metallic, non-magnetic spacer layers are formed of material selected from the group consisting of the metallic, non-magnetic materials Cu, Au and Ag and wherein said layers are formed to a thickness of between 0.5 nm and 10 nm.

3. The structure of claim 1 wherein the ferromagnetic layer is ferromagnetic transition metal alloy layers chosen from the group consisting of $Ni_{80}Fe_{20}$ and $Co_{90}Fe_{10}$ and are formed to a thickness of between approximately 0.5 nm and 5.0 nm.

4. The structure of claim 1 wherein the first and second magnetic nano-oxide layers are separately chosen from the group of materials consisting of $Fe_3O_4$, $CrO_2$, layers formed by surface oxidation of NiFe or CoFe, CoFeNi based spinel structures, ferrimagnetic garnets, manganites or other ferromagnetic perovskites and ferromagnetic nitrides and are formed of to a thickness between approximately 0.4 nm and 6.0 nm.

5. The structure of claim 1 wherein the first and second magnetic nano-oxide layers are formed of the same material and same thickness for the maximum magnetoresistive effect.

6. A method of forming a magnetic nano-oxide based current-perpendicular-to-plane (CPP) magnetoresistive (MR) sensor stack having an antiferromagnetically coupled magnetic nano-oxide layer and having increased perpendicular resistance and enhanced magnetoresistive properties, comprising:
   providing substrate;
   forming upon said substrate a first metallic, non-magnetic spacer layer;
   forming upon said first metallic, non-magnetic spacer layer a ferromagnetic layer;
   forming upon said ferromagnetic layer a first magnetic oxide nano-layer;
   forming upon said first magnetic oxide nano-layer a second metallic, non-magnetic spacer layer;
   forming upon said second metallic, non-magnetic spacer layer a second magnetic oxide nano-layer;
   forming upon said second metallic, non-magnetic spacer layer a third metallic, non-magnetic spacer layer formed upon said second metallic, non-magnetic spacer layer.

7. The method of claim 6 wherein the first, second and third metallic, non-magnetic spacer layers are formed of material selected from the group consisting of the metallic, non-magnetic materials Cu, Au and Ag and wherein said layers are formed to a thickness of between 0.5 nm and 10 nm.

8. The method of claim 6 wherein the ferromagnetic layer is ferromagnetic transition metal alloy layers chosen from the group consisting of $Ni_{80}Fe_{20}$ and $CO_{90}Fe_{10}$ and are formed to a thickness of between approximately 0.5 nm and 5.0 nm.

9. The method of claim 6 wherein the first and second magnetic nano-oxide layers are separately chosen from the group of materials consisting of $Fe_3O_4$, $CrO_2$, layers formed by surface oxidation of NiFe or CoFe, CoFeNi based spinel structures, ferrimagnetic garnets, manganites or other ferromagnetic perovskites and ferromagnetic nitrides and are formed of to a thickness between approximately 0.4 nm and 6.0 nm.

10. The structure of claim 9 wherein the first and second magnetic nano-oxide layers are formed of the same material and same thickness for the maximum magnetoresistive effect.

* * * * *